United States Patent
Tanghe et al.

(10) Patent No.: US 11,094,688 B2
(45) Date of Patent: Aug. 17, 2021

(54) ISOLATION ARCHITECTURE

(71) Applicant: Analog Devices International Unlimited Company, Limerick (IE)

(72) Inventors: Steven J. Tanghe, Essex Junction, VT (US); Kevin R. Wrenner, Essex Junction, VT (US); Michael Amato, Livermore, CA (US)

(73) Assignee: Analog Devices International Unlimited Company, Limerick (IE)

( * ) Notice: Subject to any disclaimer, the term of this patent is extended or adjusted under 35 U.S.C. 154(b) by 303 days.

(21) Appl. No.: 16/111,125

(22) Filed: Aug. 23, 2018

(65) Prior Publication Data

US 2020/0066707 A1 Feb. 27, 2020

(51) Int. Cl.
*H01L 27/02* (2006.01)
*H02H 9/04* (2006.01)
*H01L 25/065* (2006.01)
*H01L 21/761* (2006.01)
*H04B 1/40* (2015.01)

(52) U.S. Cl.
CPC ......... *H01L 27/0248* (2013.01); *H02H 9/046* (2013.01); *H01L 21/761* (2013.01); *H01L 25/065* (2013.01); *H04B 1/40* (2013.01)

(58) Field of Classification Search
CPC . H01L 27/0248; H01L 25/065; H01L 21/761; H01L 27/0288; H01L 27/0255; H01L 23/60; H01L 23/645; H01L 23/642; H02H 9/046; H04B 1/40
USPC .......................................................... 361/56
See application file for complete search history.

(56) References Cited

U.S. PATENT DOCUMENTS

| | | | |
|---|---|---|---|
| 5,416,351 | A | 5/1995 | Ito et al. |
| 5,899,714 | A | 5/1999 | Farrenkopf et al. |
| 6,081,586 | A | 6/2000 | Rahamim et al. |
| 6,124,756 | A | 9/2000 | Yaklin et al. |
| 6,351,530 | B1 | 2/2002 | Rahamim et al. |
| 6,359,973 | B1 | 3/2002 | Rahamim et al. |

(Continued)

FOREIGN PATENT DOCUMENTS

| | | |
|---|---|---|
| CN | 102916386 A | 2/2013 |
| CN | 203933593 U | 11/2014 |

(Continued)

*Primary Examiner* — Dharti H Patel
(74) *Attorney, Agent, or Firm* — Schwegman Lundberg & Woessner, P.A.

(57) ABSTRACT

The subject technology provides for an architecture that isolates two interfaces of a circuit with an isolating communication element while also protecting against overstress transients such as electro-static discharge (ESD) and other electrical overstress (EOS) transients across the isolating communication element that can be significantly larger than the ESD rating of the isolating communication element, and/or that may be repeated in succession. The subject technology provides isolation using a two die implementation with an isolation interface including an isolation tub in each die, or a single die containing both isolation tubs in the die. The two dice include respective substrates that are connected together and float with respect to any signal or ground. The isolation enables a large offset voltage on the order of hundreds of volts to exist between the sides. Being relatively large, each isolation tub can handle a significant amount of energy.

20 Claims, 4 Drawing Sheets

(56) References Cited

U.S. PATENT DOCUMENTS

| | | |
|---|---|---|
| 6,525,566 B2 | 2/2003 | Haigh et al. |
| 8,022,498 B1 | 9/2011 | Khieu et al. |
| 8,049,573 B2 | 11/2011 | Alfano et al. |
| 8,222,698 B2 | 7/2012 | Salcedo et al. |
| 1,282,010 A1 | 11/2012 | Ng et al. |
| 8,405,152 B2 | 3/2013 | Woo et al. |
| 8,571,093 B1 | 10/2013 | Van de Beek |
| 8,680,690 B1 | 3/2014 | Steeneken et al. |
| 9,257,834 B1 | 2/2016 | Moghe et al. |
| 9,275,991 B2 | 3/2016 | Salcedo et al. |
| 2008/0181316 A1 | 7/2008 | Crawley et al. |
| 2012/0295539 A1 | 11/2012 | McCormack et al. |
| 2015/0200162 A1 | 7/2015 | Constantino et al. |
| 2015/0236009 A1 | 8/2015 | Gill et al. |
| 2018/0062678 A1* | 3/2018 | Ragonese ........... H03F 3/45183 |

FOREIGN PATENT DOCUMENTS

| | | |
|---|---|---|
| DE | 102019005852 A1 | 2/2020 |
| TW | 202017145 A | 5/2020 |
| WO | WO-2003/051010 A1 | 6/2003 |
| WO | WO-2013/108065 A1 | 7/2013 |

* cited by examiner

ISOLATION ARCHITECTURE

FIELD OF THE DISCLOSURE

The present description relates generally to electrical circuits, and more particularly, to isolation architecture.

BACKGROUND

In interface circuits, a desirable feature is electronic isolation, in which the circuit tolerates offsets and disturbances in the voltage between multiple interfaces. Another desirable feature is robustness against electrical overstress (EOS) transients, including electrostatic discharges (ESD). Yet some isolated circuits with relatively large isolation voltage ratings are still vulnerable to damage from ESD transients across the isolation barrier, especially when subjected to repeated discharges in succession. Often the isolating communication element is the "weak link" in the ESD ratings for the circuit.

SUMMARY OF THE DISCLOSURE

The subject technology provides for an architecture that isolates two interfaces of a circuit with an isolating communication element while also protecting against overstress events such as ESD and other EOS transients across the isolating communication element. The architecture protects the isolating communication element against ESD transient voltages that can be significantly larger than the voltage rating of the isolating communication element, and/or that can be repeated in succession. The subject technology provides isolation using a two-die implementation that includes an isolation element (off-chip or on-chip), an isolation tub rated for high voltage on each die, and floating die substrates that are connected together. In this implementation, each isolation tub is rated for 150V. The overall isolation enables a large offset voltage on the order of hundreds of volts to exist between its interfaces. In some implementations, the isolation tub can span nearly the entire size of the integrated circuit die and can handle a significant amount of energy during an EOS event.

According to an embodiment of the present disclosure, an apparatus for isolating a plurality of interfaces from electrical overstress transients is provided. The apparatus includes a first integrated circuit device associated with a first voltage domain, and a second integrated circuit device associated with a second voltage domain, in which the second integrated circuit device is disposed on a different die than the first integrated circuit device. The apparatus includes an isolating communication element coupled to the first integrated circuit device and the second integrated circuit device and configured to provide signaling and electrical isolation between the first integrated circuit device and the second integrated circuit device, in which a voltage rating of the signaling and electrical isolation is defined by a voltage clamp set by a breakdown voltage.

According to an embodiment of the present disclosure, an apparatus for isolating a plurality of interfaces from electrical overstress transients is provided. The apparatus includes a first integrated circuit die and a second integrated circuit die. The apparatus includes a first isolation tub associated with a first voltage domain and disposed on the first integrated circuit die, and a second isolation tub associated with a second voltage domain and disposed on the second integrated circuit die. The apparatus also includes an isolating communication element coupled to first circuitry within the first isolation tub and to second circuitry within the second isolation tub and configured to provide signaling and electrical isolation between the first isolation tub and the second isolation tub, in which a voltage rating of the signaling and electrical isolation is defined by a voltage clamp set by a breakdown voltage.

According to an embodiment of the present disclosure, an apparatus for isolating a plurality of interfaces from electrical overstress transients is provided. The apparatus includes a substrate, a first integrated circuit device disposed on the substrate, and a second integrated circuit device disposed on the substrate. The apparatus also includes an isolating communication element coupled to the first integrated circuit device and the second integrated circuit device and configured to provide signaling and electrical isolation between the first integrated circuit device and the second integrated circuit device, in which a voltage rating of the signaling and electrical isolation is defined by a voltage clamp set by a breakdown voltage.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

Figure 1:
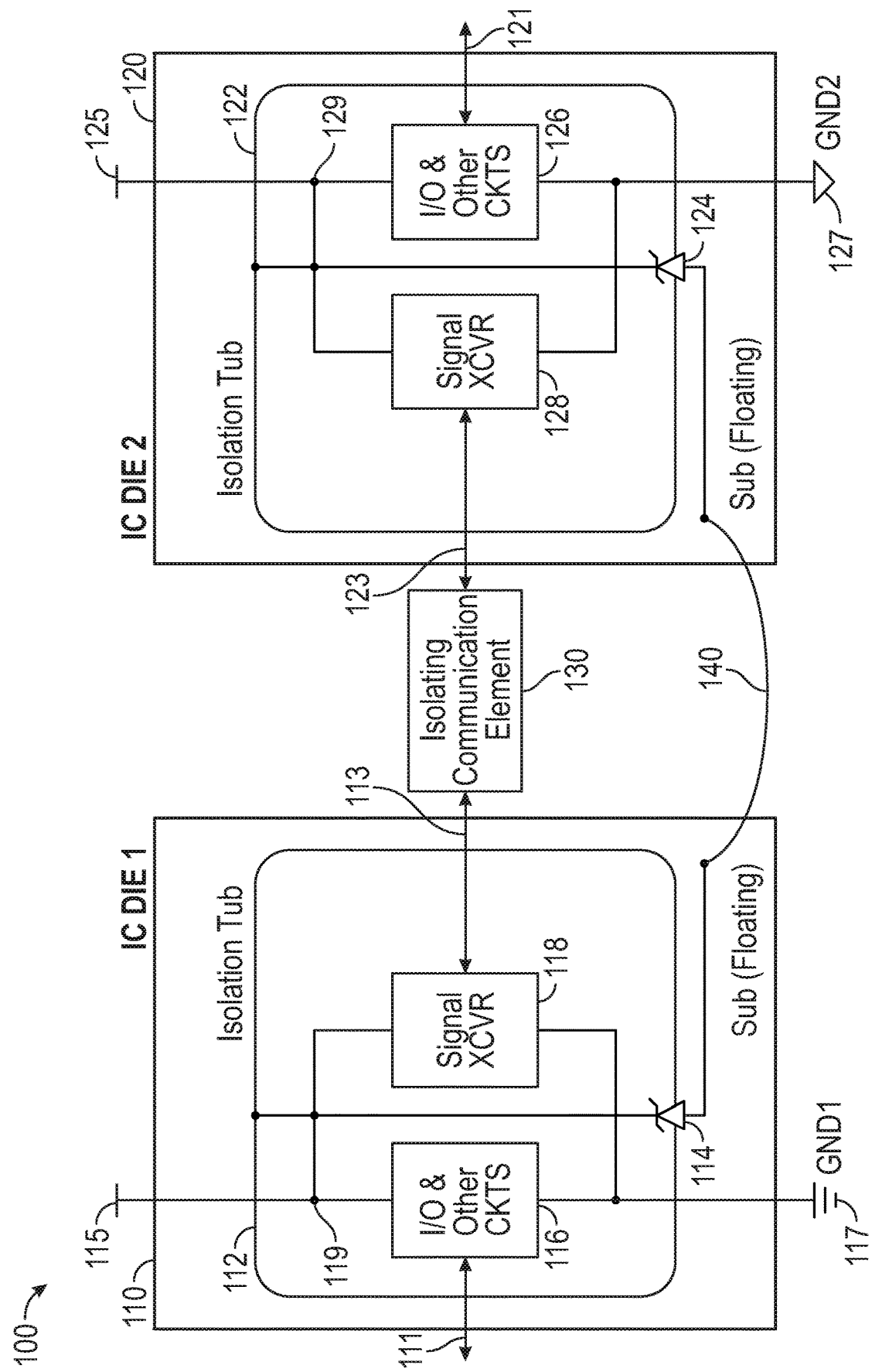
FIG. 1 illustrates a schematic diagram of an example of an isolation architecture with multiple integrated circuit dice in accordance with one or more implementations of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

The subject disclosure provides for an architecture that isolates two interfaces of a circuit with an isolating communication element while also protecting against overstress transients such as electrostatic discharge (ESD) and other electrical overstress (EOS) transients across the isolating communication element. The architecture protects the isolating communication element against ESD voltage transients that can be significantly larger than the voltage rating of the isolating communication element, and/or that can be repeated in succession. For example, the subject technology is directed to an application that isolates two sides of a communication bus that can tolerate up to a predetermined amount of voltage differential (e.g., +/−150 V) between two ground terminals of devices connected to the communication bus. In some implementations, the bus is an I²C (Inter-Integrated Circuit) bus. However, the isolation architecture is not limited to I²C. For example, the bus may be a System Management Bus (or SMBus) or consist of general purpose input/output (GPIO) signals.

Various architectures of isolated transceivers can have isolated voltage supply (e.g., VCC) and ground (e.g., GND) pins. In some traditional approaches, galvanic isolators may rely on the isolation voltage to stand off the EOS, but the ESD rating across the isolating communication element may not keep pace with the interface pins themselves. Also, the isolating communication element can readily be vulnerable to multiple ESD strikes repeated in succession as charge accumulates in the isolating communication element with each strike. The subject technology provides for an architecture that isolates between two interfaces while also protecting against overstress transients such as ESD across the isolating communication element. For example, the subject technology provides for an isolation architecture that supports 150V level shifting between sides. In traditional signal isolation approaches, it is unusual to have a significant ESD rating across the isolating communication element. In contrast to traditional signal isolation approaches, the subject technology provides a substantial ESD rating across the isolating communication element. The subject technology also provides for using an integrated circuit package with a relatively small package. In this respect, the subject technology is a smaller solution compared to traditional signal isolation approaches such as a larger full galvanic isolated architecture.

The subject technology provides several other advantages over traditional isolation architectures. For example, for a two-die implementation, clamping is completely free of snapback (e.g., a parasitic bipolar device breakdown mechanism that reduces the clamping voltage), eliminating the liability of damage resulting from an ESD strike while operating with a ground offset between sides that is forced or held by low impedance. The subject technology is also compatible with traditional IC process technologies such as BCD (Bipolar Complementary-Metal-Oxide-Semiconductor (CMOS) Double-Diffused-Metal-Oxide-Semiconductor (DMOS)) or BiCMOS (Bipolar-CMOS). In some aspects, more expensive process technology options such as high voltage field-effect-transistor (FET) structures or silicon-on-insulation (SOI) are not required.

In some examples, the subject technology allows I/O card insertion into a live backplane without corruption of the data and clock busses. When the connection is made, the subject technology can provide bidirectional buffering, keeping the backplane and interface circuits isolated. In some implementations, the isolation architecture may be implemented as a buffer and/or accelerator, where the isolation architecture can support ±/−150V ground level-shifting in a bus (e.g., I²C or SMBus). In some aspects, the isolation architecture can support at least +/−20 kV HBM (human-body-model) ESD including across the isolating communication element.

In one embodiment, the subject technology includes two integrated circuit dice that coexist close to each other in a relatively small IC package. The subject technology provides isolation using a two-die implementation with isolation (off-chip or on-chip) including an isolation tub in each die. In this implementation, the two die are implemented with respective floating substrates, connected only to each other. In some implementations, a first substrate on a first IC die is coupled to a second substrate on a second IC die. The isolation is provided with the floating substrates relative to the respective isolation tub and package. In some aspects, the isolation enables a large offset voltage to coexist between the sides on the order of 100's of volts (e.g., 150V). In some implementations, the isolation tub comprises n-type material (e.g., dopant). The isolation tub may generally refer to an "n-tub" or an "n-type well." The isolation tub is formed in a substrate of a different type of material (e.g., p-type dopant). In this case, the n-tub dopant concentration may be high enough to counter dope the p-type substrate. In some implementations, the isolation tub can span the entire size of the integrated circuit die, and therefore, the isolation tub can handle a significant amount of energy. In some implementations, the isolation tub is an ultra-high voltage (UHV) tub. In other implementations, the isolation tub is a high-voltage tub or a medium-voltage tub.

The subject disclosure provides for an isolation architecture that includes two integrated circuit dice. In some implementations, each die has a p-type substrate. The isolation architecture also includes two n-type tubs rated for ultra high voltage (UHV) breakdown voltage to their respective substrates. In some implementations, each tub (e.g., one per die) contains circuitry for one side of the isolating communication element. The isolation architecture also includes two transceivers that signal to each other across the isolating communication element. The substrates of the two dice are connected together and "float" with respect to all other signals.

In another embodiment, the subject technology includes a single integrated circuit die with isolation devices contained within the die in a similarly small IC package. For example, the isolation architecture can be implemented on a single IC die with two separate isolation tubs at their respective voltages and the substrate is floating. In this implementation, no additional connection between two different dice would be needed.

FIG. 1 illustrates a schematic diagram of an example of an isolation architecture 100 in accordance with one or more implementations of the subject technology. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The isolation architecture 100 includes a first integrated circuit die 110, a second integrated circuit die 120, and an isolating communication element block 130. The first integrated circuit die 110 includes an isolation tub 112 and a first tub-substrate breakdown diode 114. The isolation tub 112 includes an input/output (I/O) circuit interface 116 and a signal transceiver 118. The second integrated circuit die 120 includes a isolation tub 122 and a second tub-substrate breakdown diode 124. The isolation tub 122 includes an I/O circuit interface 126 and a signal transceiver 128. In some implementations, each of the isolation tubs 112 and 122 includes n-type material (e.g., n-type dopant). The isolation tubs 112 and 122 may generally refer to an "n-tub" or an "n-type well." The isolation tubs 112 and 122 may be formed in a substrate of a different type of material (e.g., p-type dopant). In this case, the n-tub dopant concentration may be high enough to overcompensate for the doping of the p-type substrate. In other implementations, each of the isolation tubs 112 and 122 includes p-type material (e.g., p-type dopant) and the substrate of each of the dies 110 and 120 includes n-type material (e.g., n-type dopant).

In FIG. 1, the signal interface 111 represents a bidirectional signaling between a first supply 115 for the first IC die (e.g., VCC1) and a first ground 117 for the first IC die e.g., GND1). The signaling of the signal interface 111 is bounded between the two voltage levels (e.g., VCC1, GND1). In some aspects, an objective is to have that signaling (e.g., 111) traverse across the two IC dice 110 and 120 and the isolating communication element 130 to the other side (e.g., 121). The other side includes the signal interface 121 that represents a bidirectional signaling between a second supply 125 for the second IC die (e.g., VCC2) and a second ground 127 for the second IC die (e.g., GND2) at their respective levels. In this example, the two grounds, GND1 (e.g., 117) and GND2 (e.g., 127), can be separate from one another such that they move hundreds of volts apart and the isolating communication element (e.g., 130) carries internal signaling (e.g., 113, 123) from side to side. In FIG. 1, the first ground 117 and the second ground 127 can float with respect to each other. In some implementations, the first supply 115 is associated with a first voltage domain (e.g., +5V with respect to GND1), and the second supply 125 is associated with a second voltage domain (e.g., +125V with respect to GND1). In this respect, the first voltage domain and the second voltage domain are associated with different voltages.

In some implementations, each isolated technology has limits to the voltage tolerated between interfaces. The subject technology allows hundreds of volts of separation. In this respect, the isolating communication element 130 may provide a static voltage separation or may provide enough separation that occurs temporarily. In some implementations, the isolating communication elements 130 can be implemented by different means such as using resistive elements or inductive transformers. In other implementations, the isolating communication elements 130 can be implemented with capacitive elements. For example, the isolating communication elements 130 can instead include signaling by capacitors across the isolation interface. For example, the isolating communication elements 130 may include an oxide material such as silicon dioxide to provide capacitive isolation between the two sides, such that the thickness of the oxide may determine the amount of isolation provided across the isolating communication element 130.

In some implementations, the first integrated circuit die 110 includes a p-type substrate and the first isolation tub 112 includes an n-type material. As depicted in FIG. 1, the first isolation tub 112 is connected to the first power supply 115 (e.g., VCC1) at node 119. Because the first isolation tub 112 is an ultra-high-voltage rated tub, it can handle a reverse bias into the p-type material of the substrate up to a voltage that corresponds to the amount targeted for isolation between the two sides (e.g., 150 V). In this respect, the first isolation tub with n-type material can be brought up about 150 V away from the p-type substrate. In some implementations, the second integrated circuit die 120 also includes a p-type substrate and the second isolation tub 122 also include an n-type material. The second integrated circuit die 120 along with the second isolation tub 122 includes features and operates similarly to the first integrated circuit die 110 and the first isolation tub 112, respectively.

The first tub-substrate breakdown diode 114 is formed by the junction between the first isolation tub 112 and the substrate of the first integrated circuit die 110 (hereinafter referred to as the "tub-sub junction"). In some implementations, the anode terminal of the first tub-substrate breakdown diode 114 is the p-type substrate, and the cathode terminal of the diode 114 is the n-type isolation tub 112. One of these terminals of the first tub-substrate breakdown diode 114 (e.g., the cathode) may operate at a significantly higher voltage (e.g., 120 V) than the other terminal (e.g., the anode) to operate between two different voltage domains and serve as a voltage clamp to the side operating in the lower voltage. In the present disclosure, the p-type substrate will follow the ground terminal with the lowest potential tub, within a forward diode drop voltage.

In some implementations, the second ground 127 (e.g., GND2) may be set to a positive voltage with respect to the first ground 117 (e.g., GND1) that could be large in magnitude. For example, the first supply 115 (e.g., VCC1) is set to 5V with respect to the first ground 117 (e.g., GND1), and the second supply 125 (e.g., VCC2) is set to 5V with respect to the second ground 127 (e.g., GND2), and the second ground (e.g., GND2) is +120V with respect to the first ground 117 (e.g., GND1). In some aspects, the second supply 125 (e.g., VCC2) remains constant with respect to the second ground 127 (e.g., GND2) even if the second ground 127 (e.g., GND2) changes with respect to the first ground 117 (e.g., GND1). In other words, there may be a voltage source between VCC (e.g., 115, 125) and GND (e.g., 117, 127) on each side, and those voltage sources are fixed and can be shifted with respect to one another. The voltages of the first supply 115, the second supply 125, and the second ground 127 relative to the first ground 117 can be set to different values from those described in reference to FIG. 1 without departing from the scope of the present disclosure.

If the second ground 127 (GND2) voltage becomes sufficiently positive with respect to the first ground 117 (GND1), it will be clamped, or limited, by diodes 114 and 124. In some implementations, each of the diodes 114 and 124 is a Zener diode. In some implementations, each of the diodes 114 and 124 has a reverse breakdown voltage that is set to +150V and a forward bias voltage of +0.7V.

In some aspects, the isolation voltage rating between the two interfaces is set by the TUB-SUB breakdown voltage. In other words, the ESD protection across the isolating communication element 130 is defined predominantly by a clamp set by the TUB-SUB breakdown voltage. Because the clamping voltage is high (e.g., 150V), the power dissipated by this clamp during an ESD strike is also high. However, in comparison to a standard low-voltage ESD clamp, the ESD current per width of the ESD clamp (e.g., $I_{ESD}/W_{CLAMP}$) is relatively low, because the width can be made large—essentially the perimeter of the whole integrated circuit die. Additionally, the power density (e.g., proportional to $V_{CLAMP}*I_{ESD}/A_{CLAMP}'$, where $A_{CLAMP}'$ is the effective area of silicon actively clamping the discharge) is relatively low, because $A_{CLAMP}'$ is relatively large. Because a low power density is inherently achievable by the size of the isolation tub (e.g., 112, 122), the ESD network can be designed to reliably clamp discharges at significantly high ESD levels (e.g., tens of kV).

Each of the tub-substrate breakdown diodes 114 and 124, when it breaks down at the breakdown voltage, is clamping the voltage between these two domains (e.g., 0V, 150V) when the circuit is hit with an ESD strike or other EOS transient (e.g., an energy surge). In this respect, each of the tub-substrate breakdown diodes 114 and 124 is protecting against the EOS transients from causing any further damage to the circuit.

In some implementations, the second ground 127 (e.g., GND2) may be set to a negative voltage with respect to the first ground 117 (e.g., GND1) that could be large in magnitude (e.g., −120V). For example, the first supply 115 (e.g., VCC1) is set to 5V with respect to the first ground 117 (e.g., GND1), and the second supply 125 (e.g., VCC2) is set to 5V with respect to the second ground 127 (e.g., GND2), and the second ground (e.g., GND2) is −120V with respect to the first ground 117 (e.g., GND1). If the second ground 127 (GND2) voltage becomes sufficiently negative with respect to the first ground 117 (GND1), it will be clamped, or limited, by the tub-substrate breakdown diodes 114 and 124.

The preferred two-die implementation eliminates NPN snapback during clamping. All NPN behavior (which requires minority carrier base transport) is eliminated due to a metallic conductor (e.g., a wire) between the two integrated circuit dice. For example, the substrate connection (e.g., 140) provides protection against ESD from one side (e.g., the first integrated circuit die 110) to the other side (e.g., the second integrated circuit die 120). If the wiring that makes up the substrate connection 140 is removed across the two integrated circuit dice (e.g., 110, 120), the overall circuit may not clamp the ESD strikes. Sans the substrate connection 140, a full ESD strike voltage can travel across via the signal interfaces (e.g., 113, 123) to other lower voltage elements in the circuit such as a receiver in a transceiver interface (e.g., 118, 128). As such, if the wire is broken (or removed), damage would be incurred to lower voltage-rated elements in the circuit.

The isolation tub (e.g., 112, 122) is configured to tolerate the full breakdown voltage applied across its SUB-TUB junction without affecting the circuitry contained within it, allowing the use of standard low-voltage circuit elements. In some implementations, there is a single isolating communication element. In other implementations, there are multiple isolating communication elements. In some implementations, the isolating communication element(s) 130 are integrated within the integrated circuits. In other implementations, the isolating communication element(s) 130 are integrated external to the IC(s). The signaling between the isolation interfaces can be single-ended in some implementations, or can be differential in other implementations. The signaling between the isolation interfaces can be full-duplex in some implementations, or can be half-duplex in other implementations.

Figure 2:
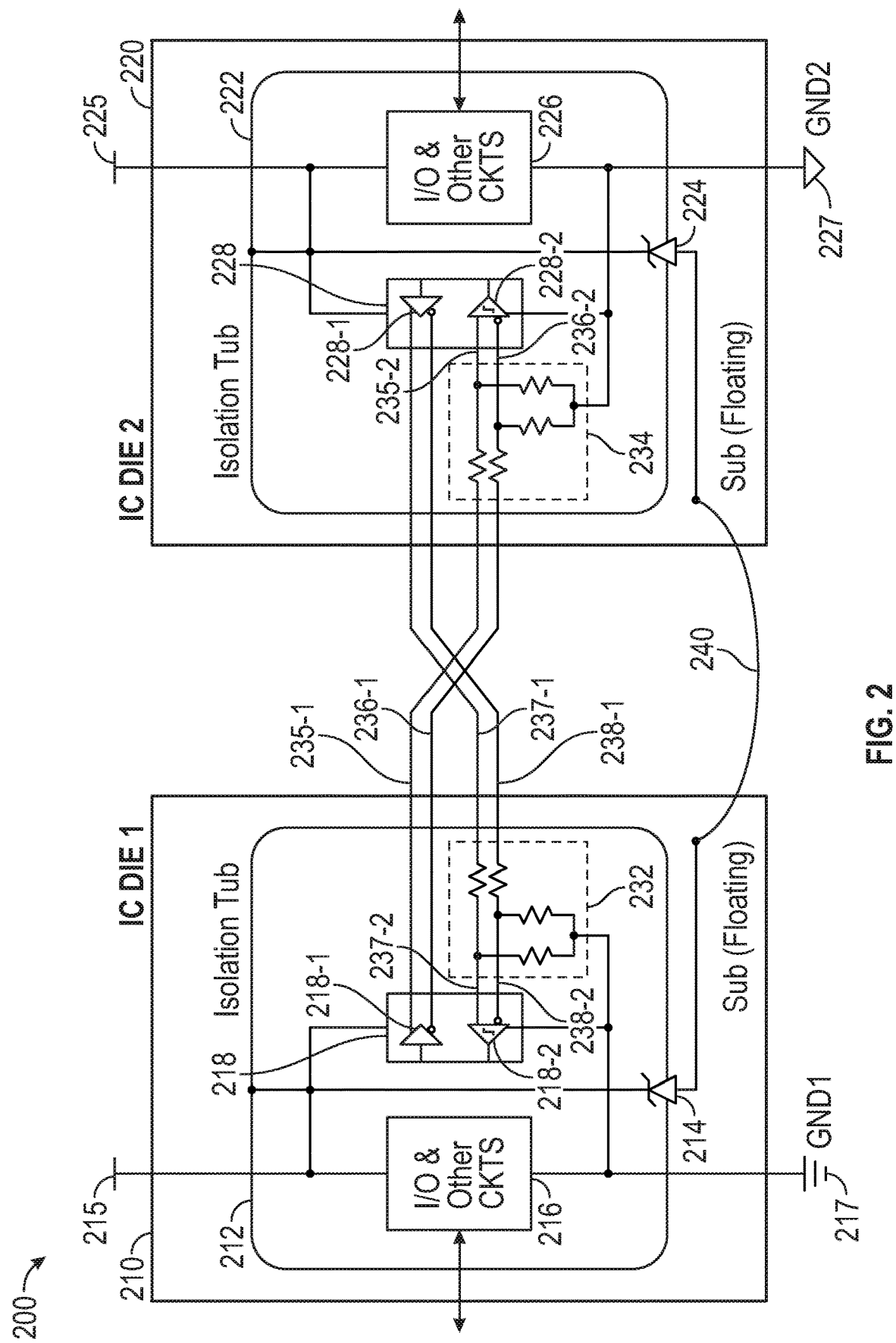
FIG. 2 illustrates a schematic diagram of an example of an isolation architecture with resistive isolating communication elements in accordance with one or more implementations of the subject technology.

FIG. 2 illustrates a schematic diagram of an example isolation architecture 200 with resistive isolating communication elements in accordance with one or more implementations of the subject technology. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The isolation architecture 200 includes a first integrated circuit die 210, a second integrated circuit die 220, and isolating communication elements 232 and 234. The first integrated circuit die 210 includes a isolation tub 212 and a tub-substrate breakdown diode 214. The isolation tub 212 includes an I/O circuit interface 216 and a signal transceiver 218. The second integrated circuit die 220 includes an isolation tub 222 and a tub-substrate breakdown diode 224. The isolation tub 222 includes an I/O circuit interface 226 and a signal transceiver 228. As illustrated, the isolating communication elements 232 and 234 each includes a resistive divider (hereinafter referred to as "resistive divider 232" and "resistive divider 234," respectively).

The cathode terminal of the tub-substrate breakdown diode 214 is coupled to the isolation tub 212. The anode terminal of the tub-substrate breakdown diode 214 is coupled to the substrate of the first integrated circuit die 210. The cathode terminal of the tub-substrate breakdown diode 224 is coupled to the isolation tub 222. The anode terminal of the tub-substrate breakdown diode 224 is coupled to the substrate of the first integrated circuit die 220.

The signal transceiver 218 includes a transmitter 218-1 and a receiver 218-2. In some aspects, the receiver 218-1 is a receiver with a hysteresis property. The signal transceiver 228 includes a transmitter 228-1 and a receiver 228-2. In some aspects, the receiver 228-2 is a receiver with a hysteresis property.

In FIG. 2, the isolation architecture 200 depicts an example implementation with non-galvanic isolation. In this example, the isolating communication elements includes a resistive divider 232 inside the first integrated circuit die 210 that divides the voltage of signals sourced from the transmitter 228-1 to smaller voltages at the receiver 218-2, and the resistive divider 234 inside the second integrated circuit die 220 that divides the voltage of signals sourced from the transmitter 218-1 to smaller voltages at the receiver 228-2.

In some implementations, the transmitters 218-1 and 228-1 are differential transmitters. In some implementations, the receivers 218-2 and 228-2 are differential receivers. As depicted in FIG. 2, the first output (e.g., 235-1) of the transmitter 218-1 is coupled to the first input (e.g., 235-2) of the receiver 228-2, and the second output (e.g., 236-1) of the transmitter 218-1 is coupled to the second input (e.g., 236-2) of the receiver 228-2. The first output (e.g., 237-1) of the transmitter 228-1 is coupled to the first input (e.g., 237-2) of the receiver 218-2, and the second output (e.g., 238-1) of the transmitter 228-1 is coupled to the second input (e.g., 238-2) of the receiver 218-2.

The resistive divider 232 is used to shift the voltage levels of the incoming signaling (e.g., 237-1, 238-1) arriving across the isolation interface. In some aspects, the transceiver 218 includes a receiver with hysteresis that can only accept a relatively small voltage. In this example, the resistive divider 232 operates to reduce a relatively large voltage (e.g., +125V) from the second integrated circuit die 220 down to a smaller voltage (e.g., +1V) that is acceptable to the receiver in the first integrated circuit die 210. In some aspects, the resistive divider 232 operates as a voltage attenuator.

Figure 3:
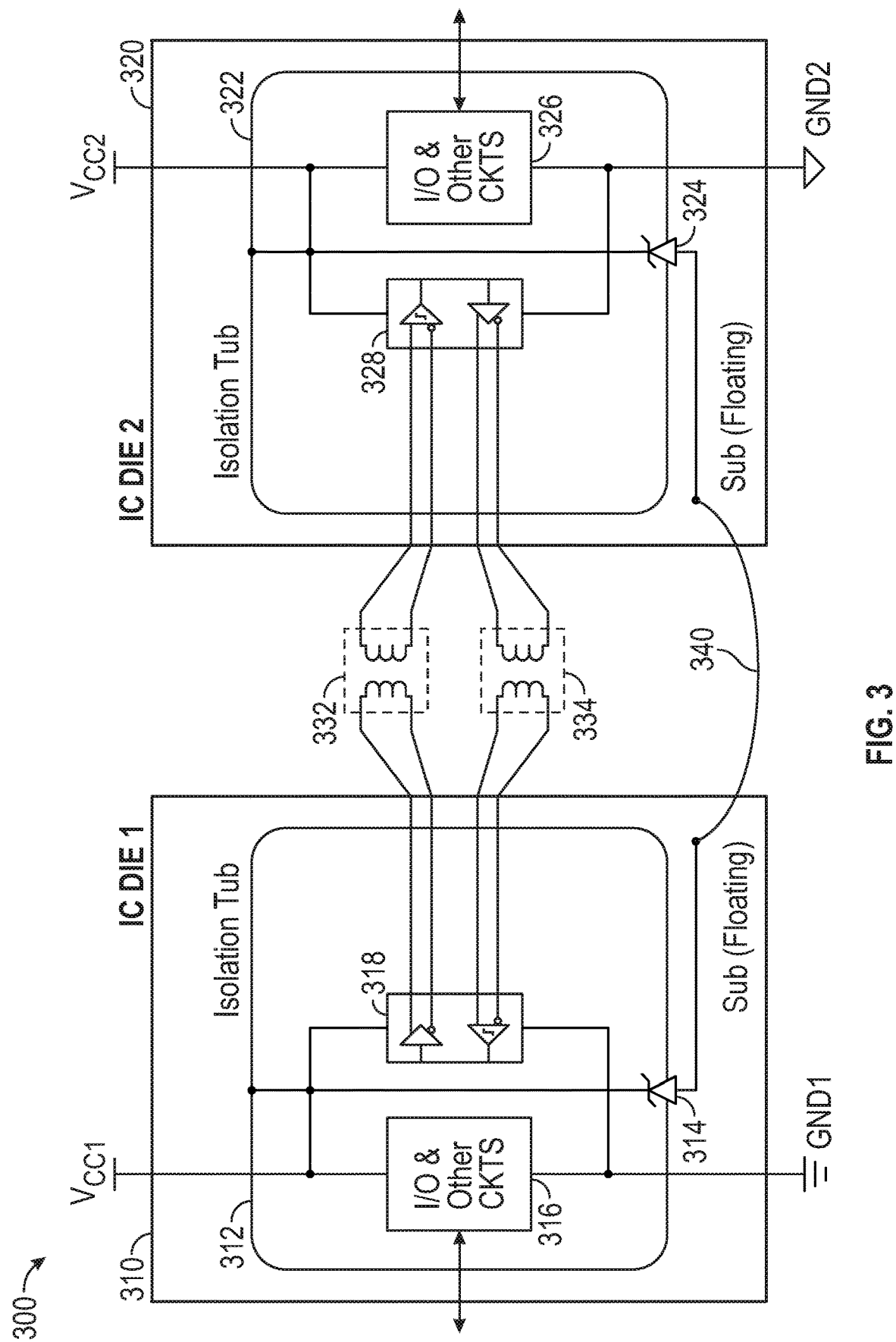
FIG. 3 illustrates a schematic diagram of an example of an isolation architecture with transformer isolating communication elements in accordance with one or more implementations of the subject technology.

FIG. 3 illustrates a schematic diagram of an example of an isolation architecture 300 with transformer isolating communication elements in accordance with one or more implementations of the subject technology. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided. Some of the elements depicted in FIG. 3 are closely similar to those depicted in FIG. 2 and, therefore, only elements that are different from FIG. 2 will be discussed in reference to FIG. 3.

The isolation architecture 300 includes a first integrated circuit die 310, a second integrated circuit die 320, and isolating communication element blocks 332 and 334. The first integrated circuit die 310 includes an isolation tub 312 and a tub-substrate breakdown diode 314. The isolation tub 312 includes an I/O circuit interface 316 and a signal transceiver 318. The second integrated circuit die 320 includes an isolation tub 322 and a tub-substrate breakdown diode 324. The isolation tub 322 includes an I/O circuit interface 326 and a signal transceiver 328.

In FIG. 3, the isolating communication elements 332 and 334 represent a configuration of a galvanically isolated data interface. The isolating communication elements 332 and 334 respectively include a transformer. The isolating communication elements 332 and 334 are configured to transform from a first voltage to a second voltage. In some aspects, the first voltage is associated with a first domain and the second voltage is associated with a second domain. In some aspects, the first domain has a voltage (e.g., 0V) that is smaller than that of the second domain (e.g., +120V). In other aspects, the first domain has a voltage (e.g., +120V) that is greater than that of the second domain (e.g., 0V). In FIG. 3, the excess voltage is dropped across the transformer. Accordingly, there is no DC path from one side to the other side because the transformer is AC coupled. There is no need for a resistive divider because the excess voltage is all dropped across the transformer. In some aspects, the transformer can handle as much voltage as the insulative properties of the transformer are designed to handle. In some implementations, the isolating communication element 332 and 334 can use capacitors, optocouplers, GMR. (Giant Magneto-Resistor), or many other types of isolators.

Figure 4:
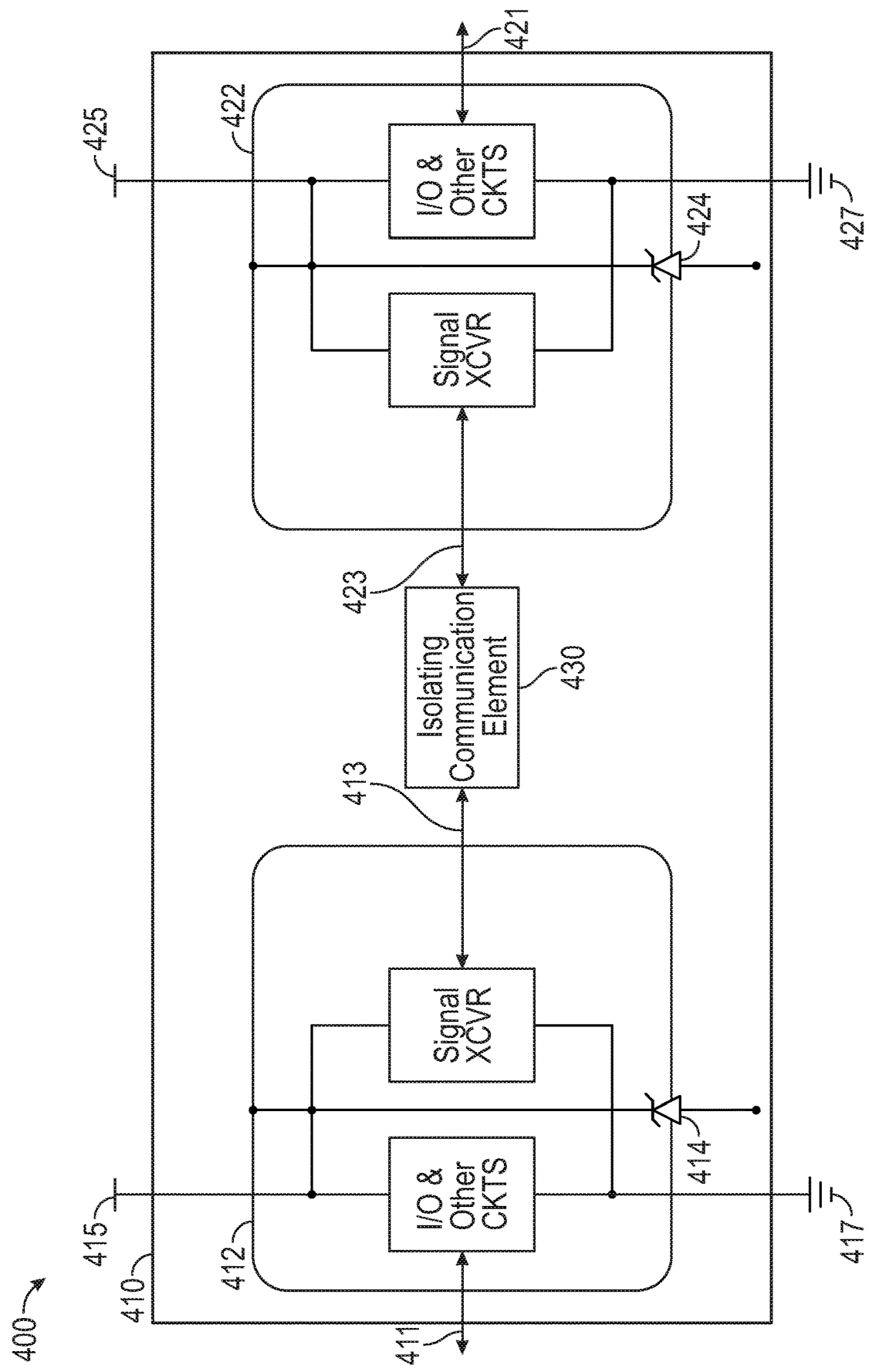
FIG. 4 illustrates a schematic diagram of an example of an isolation architecture with a single integrated circuit die in accordance with one or more implementations of the subject technology.

FIG. 4 illustrates a schematic diagram of an example of an isolation architecture 400 with a single integrated circuit die in accordance with one or more implementations of the subject technology. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided. Some of the elements depicted in FIG. 4 are closely similar to those depicted in FIG. 3 and, therefore, only elements that are different from FIG. 3 will be discussed in reference to FIG. 4.

The isolation architecture 400 includes an integrated circuit die 410, and an isolating communication element 430. The integrated circuit die 410 includes a first isolation tub 412, a first isolation tub 422, a first tub-substrate breakdown diode 414, and a second tub-substrate breakdown diode 424. The first isolation tub 412 includes an I/O circuit interface 416 and a signal transceiver 418. The second isolation tub 422 includes an I/O circuit interface 426 and a signal transceiver 428. In some implementations, the isolating communication element 430 includes one or more transformers. In one implementation, the isolating communication element 430 includes a single transformer with half-duplex signaling between the first isolation tub 412 and the second isolation tub 422. In another implementation, the isolating communication element 430 includes a single transformer with unidirectional signaling between the first isolation tub 412 and the second isolation tub 422.

In some implementations, the tubs can be integrated onto a single integrated circuit die (e.g., 410) using a layout designed to suppress (or at least limit) NPN snapback during an ESD strike. For example, the tubs could be widely separated, with the space between them filled with an oxide-based insulator (e.g., ISO), SOT (Silicon-on-Insulator) or a similar heavily doped p+ layer.

In other implementations, the isolation tubs (e.g., 112, 122) can be integrated onto a single integrated circuit die using a process technology that similarly suppresses NPN snapback. In some implementations, the ESD clamps (e.g., the tub-substrate breakdown diodes 114, 124) can be on an integrated circuit die distinct from the circuit die, with their substrates similarly connected and floating.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Headings and subheadings, if any, are used for convenience only and do not limit the subject disclosure.

The predicate words "configured to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus for isolating a plurality of interfaces from electrical overstress transients, the apparatus comprising:
a first integrated circuit device associated with a first voltage domain;

a second integrated circuit device associated with a second voltage domain, the second integrated circuit device being disposed on a different die than the first integrated circuit device;

a first voltage clamp coupled to the first integrated circuit, to limit a voltage from the second integrated circuit device responsive to a first voltage offset between the first voltage domain and the second voltage domain;

a second voltage clamp coupled to the second integrated circuit, to limit a voltage of the first integrated circuit device responsive to a second voltage offset between the first voltage domain and the second voltage domain; and an isolating communication element coupled to the first integrated circuit device and the second integrated circuit device to provide signaling and electrical isolation between the first integrated circuit device and the second integrated circuit device.

2. The apparatus of claim 1, wherein the first integrated circuit device is coupled to a first electrical ground and the second integrated circuit device is coupled to a second electrical ground that is offset from the first electrical ground.

3. The apparatus of claim 2, wherein the isolating communication element comprises one or more of a first resistive divider coupled to an input to a receiver on the first integrated circuit device and configured to reduce a voltage of an input signal, or a second resistive divider coupled to an input to a receiver on the second integrated circuit device and configured to reduce a voltage of an input signal.

4. The apparatus of claim 3, wherein the first resistive divider is configured to attenuate a first voltage from a transmitter of the second integrated circuit device into a second voltage to the receiver of the first integrated circuit device.

5. The apparatus of claim 3, wherein the second resistive divider is configured to attenuate a first voltage from a transmitter of the first integrated circuit device into a second voltage to the receiver of the second integrated circuit device.

6. The apparatus of claim 1, wherein the first voltage offset includes a negative voltage offset of the second voltage domain with respect the first voltage domain, and the second voltage offset includes a negative voltage offset of the first voltage domain with respect to the second voltage domain.

7. The apparatus of claim 1, wherein each of the first voltage clamp and the second voltage clamp includes a breakdown diode.

8. The apparatus of claim 1, wherein the first voltage clamp is coupled to the second voltage clamp via a conductive connection.

9. The apparatus of claim 1, wherein a substrate of the first integrated circuit device is coupled to a substrate of the second integrated circuit device via a conductive connection and the substrate of the first integrated circuit device and the substrate of the second integrated circuit device are each electrically floating with respect to other elements of the apparatus.

10. The apparatus of claim 1, wherein the isolating communication element comprises at least one transformer that utilizes bidirectional signaling or unidirectional signaling, wherein the at least one transformer is coupled to a transmitter of the first integrated circuit device and to a receiver of the second integrated circuit device.

11. The apparatus of claim 1, wherein the isolating communication element comprises at least one capacitive element that utilizes bidirectional signaling or unidirectional signaling, wherein the at least one capacitive element is coupled to a transmitter of the first integrated circuit device and to a receiver of the second integrated circuit device.

12. The apparatus of claim 1, wherein a first potential difference between a first supply and a first electrical ground of the first integrated circuit device is a first voltage, wherein a second potential difference between a second supply of the second integrated circuit device with respect to the first electrical ground of the first integrated circuit device is a second voltage, wherein the second voltage is different from the first voltage.

13. An apparatus for isolating a plurality of interfaces from electrical overstress transients, the apparatus comprising:

a first substrate defining a first integrated circuit die;

a second substrate defining a second integrated circuit die;

a first isolation tub comprising first circuitry, the first isolation tub associated with a first voltage domain and disposed on the first integrated circuit die, the first isolation tub and the first substrate forming a first voltage clamp; and a second isolation tub comprising second circuitry, the second isolation tub associated with a second voltage domain and disposed on the second integrated circuit die, the second isolation tub and the second substrate forming a second voltage clamp, wherein:

the first voltage clamp limits a first voltage up to a breakdown voltage at a junction between the first isolation tub and the first substrate, and the second voltage clamp limits a second voltage up to a breakdown voltage at a junction between the second isolation tub and the second substrate.

14. The apparatus of claim 13, wherein the first voltage clamp is coupled to the second voltage clamp via a conductive connection.

15. The apparatus of claim 13, wherein each of the first voltage clamp and the second voltage clamp includes a breakdown diode.

16. The apparatus of claim 15, wherein the first isolation tub is coupled to a first terminal of a first breakdown diode of the first voltage clamp, and wherein the second isolation tub is coupled to a first terminal of a second breakdown diode of the second voltage clamp, and wherein the first substrate is coupled to a second terminal of the first breakdown diode, and wherein second substrate is coupled to a second terminal of the second breakdown diode.

17. The apparatus of claim 16, wherein the first isolation tub is configured to tolerate the breakdown voltage applied across the junction between the first isolation tub and the first substrate using the first breakdown diode, and wherein the second isolation tub is configured to tolerate the breakdown voltage applied across the junction between the second isolation tub and the second substrate using the second breakdown diode.

18. An apparatus for isolating a plurality of interfaces from electrical overstress transients, the apparatus comprising:

a substrate;

a first integrated circuit device disposed on the substrate, the first integrated circuit device comprising a first isolation tub having first circuitry, the first isolation tub providing electrical isolation between signals of the first circuitry and the substrate;

a second integrated circuit device disposed on the substrate, the second integrated circuit device comprising a second isolation tub having second circuitry, the second isolation tub providing electrical isolation between signals of the second circuitry and the substrate; and an isolating communication element coupled to the first integrated circuit device and the second integrated circuit device to provide signaling and electrical isolation between the first integrated circuit device and the second integrated circuit device, wherein a voltage rating of the signaling and electrical isolation is defined by a breakdown voltage of a diode voltage clamp formed by the substrate and at least one of the first isolation tub or the second isolation tub.

19. The apparatus of claim 18, wherein the isolating communication element is coupled to the first circuitry within the first isolation tub and to the second circuitry within the second isolation tub and configured to provide signaling and electrical isolation between the first isolation tub and the second isolation tub.

20. The apparatus of claim 19, wherein the first integrated circuit device comprises a first voltage clamp configured to limit a first voltage up to the breakdown voltage at a junction between the first isolation tub and the substrate, wherein the second integrated circuit device comprises a second voltage clamp configured to limit a second voltage up to the breakdown voltage at a junction between the second isolation tub and the substrate, and wherein the first voltage clamp is coupled to the second voltage clamp via the substrate.

* * * * *